United States Patent [19]
Gaboury

[11] Patent Number: 6,140,952
[45] Date of Patent: Oct. 31, 2000

[54] DELTA SIGMA CIRCUIT WITH PULSE WIDTH MODULATED OFFSET

[75] Inventor: Michael Gaboury, Burnsville, Minn.

[73] Assignee: Rosemount Inc., Eden Prairie, Minn.

[21] Appl. No.: 09/217,872

[22] Filed: Dec. 21, 1998

Related U.S. Application Data

[60] Provisional application No. 60/068,707, Dec. 26, 1997.

[51] Int. Cl.[7] .................................. H03M 3/00
[52] U.S. Cl. ............................................. 341/143
[58] Field of Search ..................... 341/143, 155

[56] References Cited

U.S. PATENT DOCUMENTS

| | | | |
|---|---|---|---|
| 4,791,352 | 12/1988 | Frick et al. ................ | 324/60 CD |
| 5,083,091 | 1/1992 | Frick et al. ................ | 324/678 |
| 5,119,033 | 6/1992 | Frick et al. ................ | 324/607 |
| 5,153,593 | 10/1992 | Walden et al. ............. | 341/143 |
| 5,323,156 | 6/1994 | Budmiger ................. | 341/143 |
| 5,621,408 | 4/1997 | Cake et al. ................ | 341/143 |

*Primary Examiner*—Trong Phan
*Attorney, Agent, or Firm*—Westman, Champlin & Kelly, P.A.

[57] ABSTRACT

A delta sigma (also called sigma delta) analog-to-digital converter circuit has an integrator input couplable to an analog signal and has a clocked controller generating a converted digital output representing the analog signal. An offset circuit that is pulse width modulated generates an offset current to the integrator input that electronically offsets the frequency of noise in the converted output.

33 Claims, 10 Drawing Sheets

FIG. 4 DELTA-SIGMA CIRCUIT TIMING DIAGRAM

DELTA SIGMA CIRCUIT WITH PULSE WIDTH MODULATED OFFSET

The present application claims the benefit of earlier filed U.S. Provisional Application No. 60/068,707, entitled "TRANSMITTER WITH IMPROVED SIGMA DELTA NOISE REDUCTION", filed on Dec. 26, 1997.

BACKGROUND OF THE INVENTION

Various analog-to-digital converters are known that convert an analog input to a digital output. Some combination of duty cycle, timing, frequency or a counting of pulses digitally represents the analog input. One known type of analog-to-digital converter circuit is a delta sigma (also called sigma-delta or $\Sigma\Delta$ or $\Sigma\Delta$) circuit. The delta sigma circuit produces an accurate analog-to-digital conversion, however, it also can produce a repetitive, non-symmetrical digital output that includes harmonic noise at frequencies that can interfere with the converted output. For each analog input level, it is found that tone noise signals at one or more undesired frequencies can appear in the digital output. This tone noise can often fall in the same frequency range as the analog signal, causing interference. In particular, this can be a problem when the delta sigma circuit is used in a vortex flow meter, where the vortex signal itself also tends to be a single tone type of signal. Circuitry in the vortex flow meter, downstream from the delta sigma circuit can lock onto a single noise tone as if it were a vortex signal and give a false reading. There is thus a need to improve the delta sigma circuit to avoid the problems associated with noise tones created in the delta sigma modulator.

SUMMARY OF THE INVENTION

In the present invention, an offset circuit in a delta sigma analog-to-digital converter circuit is pulse width modulated to electronically offset the frequency of noise at the converter output to a non-interfering frequency.

An analog-to-digital (A/D) converter that is a delta sigma circuit has an integrator input couplable to an analog signal. The delta sigma A/D circuit has a clocked controller generating a control output and a converted digital output representing the analog signal. The offset circuit generates an offset current to the integrator input that is pulse width modulated and electronically offsets the frequency of noise in the converter output.

The circuit can be used in a vortex flow meter or other application where noise generated by the delta sigma converter is in a frequency range where it interferes with the converted analog signal.

DETAILED DESCRIPTION OF THE PREFERRED EMBODIMENTS

Figure 1:
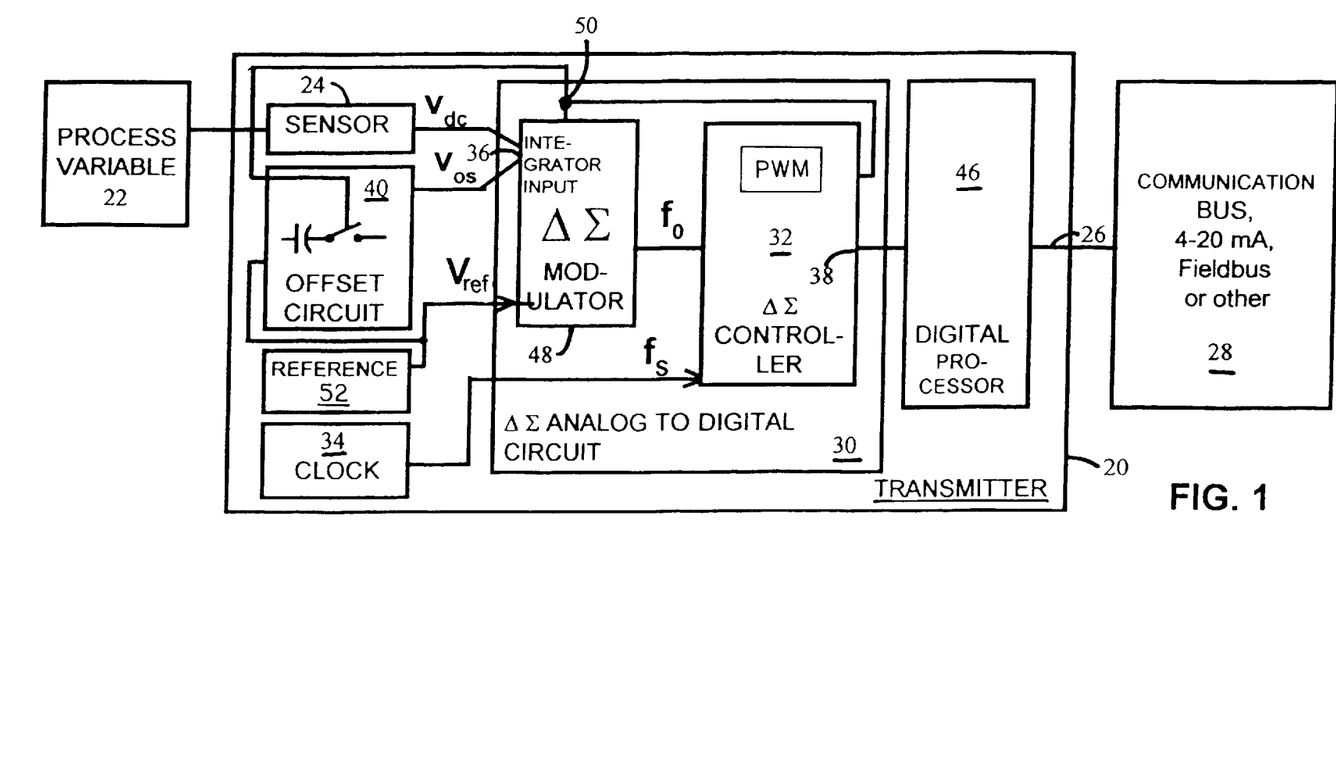
FIG. 1 is a simplified block diagram of a transmitter with a delta sigma circuit and an offset circuit.

In FIG. 1, a block diagram of a process variable transmitter 20 is shown. Process variable transmitter 20 can be configured to monitor one or more process variables 22 associated with fluids in a process plant such as slurries, liquids, vapors and gasses in chemical, pulp, petroleum, gas, pharmaceutical, food and other fluid processing plants. The monitored process variables 22 can be pressure, temperature, flow, level, pH, conductivity, turbidity, density, concentration, chemical composition or other properties of fluids.

Process variable transmitter 20 includes one or more sensors 24 that can be either internal to transmitter 20 as shown, or external to transmitter 20, depending on the installation needs of process plant 16.

Process variable transmitter 20 generates one or more transmitter outputs 26 that represent the sensed process variable. Transmitter outputs 26 are configured for transmission over long distances via a communication bus 28. In typical fluid processing plants, communication bus 28 can be a 4–20 mA current loop that powers the transmitter, or a fieldbus connection, a HART protocol communication or a fiber optic connection to a controller, a control system or a readout. In transmitters powered by a 2 wire loop, power must be kept low to provide safety in explosive atmospheres. with such low power available, circuits which conserve energy such as delta sigma circuits are especially desirable.

In FIG. 1, transmitter 20 includes an analog-to-digital converter (A/D) circuit 30 that is of a type known as a delta sigma circuit, also called a sigma delta circuit, a $\Sigma\Delta$ circuit or a $\Delta\Sigma$ circuit. The provision of a balancing current with a polarity controlled by a clocked controller coupling to an integrator is a feature of the delta sigma circuit that distinguishes the delta sigma circuit from other types of rebalancing analog to digital converters. The term "delta sigma" as used in this application is defined to mean circuits that generate an alternating polarity balancing current to an integrator under the control of a clocked controller.

Delta sigma A/D circuit 30 has an integrator input 36 that couples to an analog signal $V_{dc}$ from sensor 24. Delta sigma A/D circuit 30 includes a controller 32 that is clocked by clock 34 that generates a clock output at frequency $f_s$. Controller 32 generates a converted digital output 38 that digitally represents the analog signal. In some arrangements the output 38 of controller 32 generates two pulse counts N1 and N2 with the quantity (N1/N1+N2) representing the sensed process variable 22.

Figure 2:
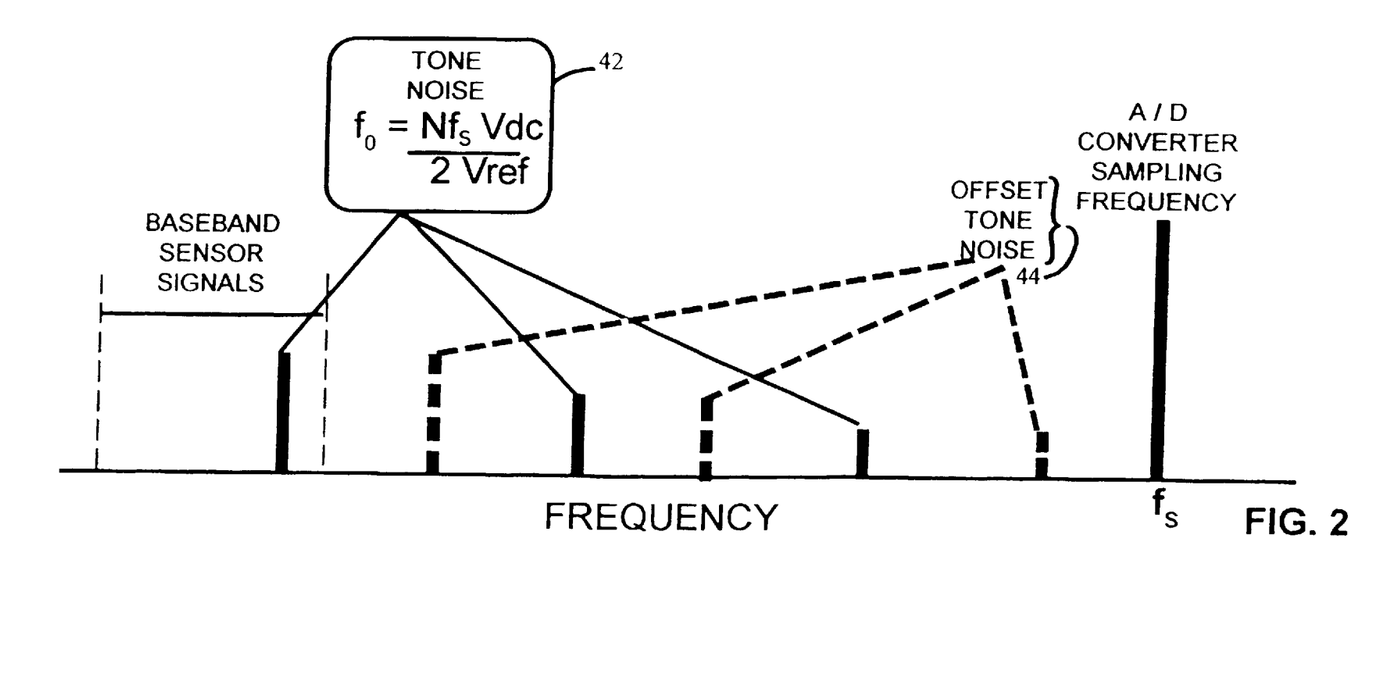
FIG. 2 is an illustration of frequencies of signals in delta sigma circuits.

An offset circuit 40 generates an offset signal $V_{os}$ to the integrator input 36 that electronically offsets the frequency of noise in the converted output 38. As shown in FIG. 2, the operation of delta sigma A/D circuit 30, when offset circuit 40 is not provided, generates noise 42 at frequencies or tones $f_0 = (Nf_s V_{dc})/2V_{ref}$ where N=1, 2, 3 ... One or more of these frequencies can fall in the baseband of signals from sensor 24 causing interference. As shown in FIG. 2, when offset circuit 40 is provided, the frequency of the noise 42 is offset and offset tone noise 44 is generated instead. Offset circuit 40 comprises a switched capacitor circuit in which one or more switches are pulse width modulated by controller 32 to control the amplitude of the offset. Pulse width modulation comprises adjusting the number and width of pulses from controller 32 controlling or modulating the actuation of one or more switches in offset circuit 40. The level of offset 40 can be adjusted or set as needed to provide adequate reduction in interference for each application without unduly limiting the dynamic range of the integrator input. The controller 32 controls the offset to be fixed for some applications, and in other applications the offset can be dithered to spread the frequency and reduce the amplitude of the tone noise so that it does not have sharply defined tones.

The output 38 of delta sigma A/D circuit 30 couples to digital processor 46 that provides further digital signal processing or filtering of the converted process variable and conditions the signal for transmission at transmitter output 26.

When transmitter 20 is a vortex flow meter, the signal generated by sensor 24 is a vortex sensor signal and is typically at a single tone or frequency representing the flow rate. In such a vortex flow meter, digital processor 46 typically includes a tracking filter that tracks the frequency of the vortex sensor signal. Moving tone noise 42 out of the baseband of the sensor signals is particularly useful with vortex flow meters because it avoids problems with the tracking filter tracking the tone noise rather than the sensor signal.

In FIG. 1 the delta sigma A/D circuit 30 includes a delta sigma modulator 48 that is controlled by control output bus 50 generated by the clocked controller 32. The delta sigma modulator 48 includes an integrator and a balancing circuit. A reference 52 couples to the delta sigma modulator 48 and the offset circuit 40 such that the offset circuit 40 tracks the delta sigma modulator 48 as a function of the reference 40. Offset circuit 40 is controlled by control output bus 50 from the clocked controller 32.

In FIG. 1, the circuitry of transmitter 20 is sealed in a transmitter housing suitable for field installation in a fluid processing plant.

Figure 3:
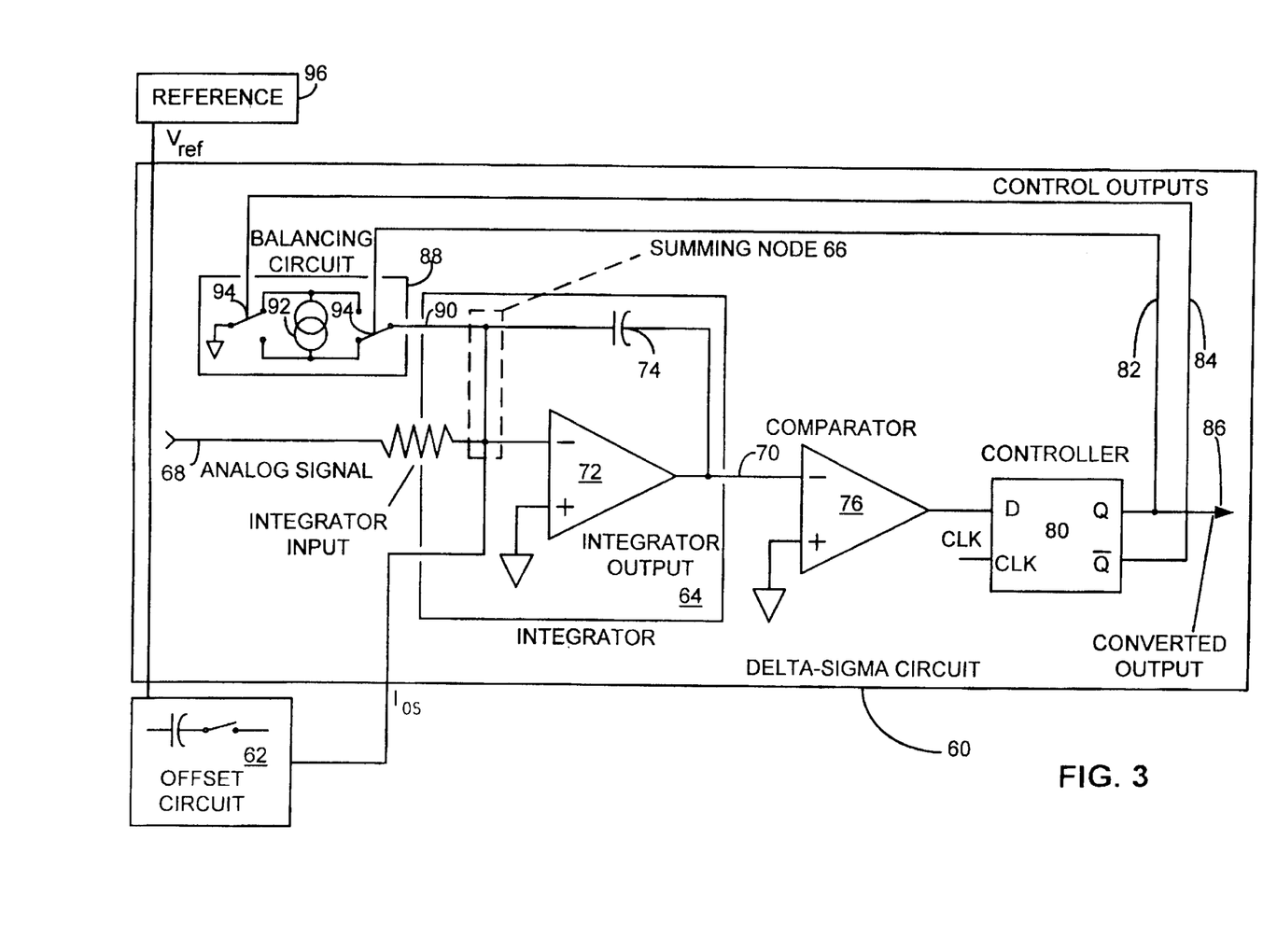
FIG. 3 is a diagram showing a first order delta sigma circuit connected to an offset circuit.

In FIG. 3, a first order delta sigma circuit 60 is shown connected to an offset circuit 62. In delta sigma circuit 60, an integrator 64 with an integrator input 66 that is a summing node couples to an analog signal 68 and generates an integrated output 70. Integrator 64 includes amplifier 72 and integrating capacitor 74. A comparator 76 receives the integrated output 70 and generates a comparison at 78. A controller 80, that can be a clocked D flip-flop, receives the comparison and generates a plurality of clocked control outputs 82, 84 and a converted output 86 that is a digital representation of the analog signal 68.

In FIG. 3, a balancing circuit 88 receives clocked control outputs 82, 84 and generates a balancing current on line 90 to the integrator input 66 that changes polarity as a function of the controller outputs 82, 84. Balancing circuit 88 includes current source 92 coupled to commutating switches 94. Commutating switches 94 are controlled by clocked controller outputs 82, 84. The magnitude of current from current source 92 is controlled by reference $V_{ref}$. The balancing current on line 90 alternates in polarity under the control of clocked controller 80.

In FIG. 3, offset circuit 62 generates an offset current to the integrator input that electronically offsets the frequency of the converted output 86. Offset circuit 62 is a switched capacitor circuit in which one or more switches are controlled by pulse width modulation to control the amplitude of the offset current. Control of switches in offset circuit 62 can be provided by controller 80 or generated within the offset circuit. The converted output 86 is typically coupled to a digital processor circuit as explained in FIG. 1. A clock CLK shown in FIG. 3 couples to the controller 80. Reference 96 couples to the balancing circuit 88 and the offset circuit 62 such that currents from the offset circuit 62 track currents from the balancing circuit 88 as a function of the reference 96. The offset circuit can generate a dc current or generate alternating currents under the control of controller 80 as needed to shift or suppress noise generated by operation of the delta sigma circuit 60.

Figure 4:
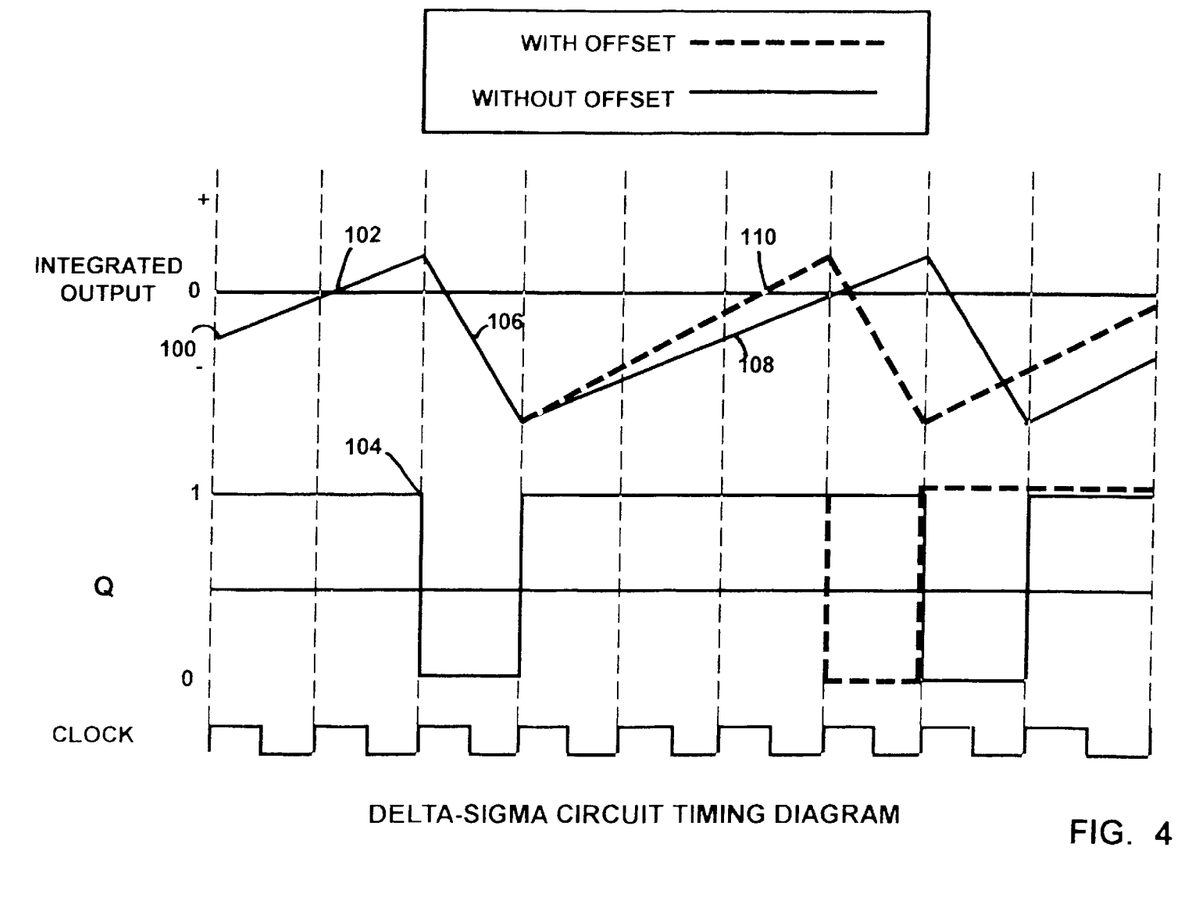
FIG. 4 is an illustration of a timing diagram of signals in FIG. 3.

In FIG. 4, a timing diagram of signals in FIG. 3 is shown. At the start 100 of the timing diagram, the integrated output is increasing and exceeds the dc common comparator level of comparator 76 at 102. At the next available leading edge of the CLOCK (CLK) signal, the controller output Q (82) changes from a "1" to a "0" at 104. The change of the control outputs at 104 changes the polarity of the balancing current and the integrated output begins decreasing as shown at 106.

In FIG. 4, when there is no offset current provided, the operation of delta sigma circuit continues on as shown by the solid line 108. However, when the offset current is provided, the operation of the delta sigma circuit continues at a different frequency as shown by dashed line 110. The offset circuit 62 offsets the frequency of operation of the delta-sigma circuit. The noise that is offset by the offset current is tone noise that is offset from an interfering frequency. The balancing current on line 90 alternates in polarity and thus the integrator 64, comparator 76, clocked controller 80 and balancing circuit 88 function as a delta sigma analog-to-digital converter circuit 60. The analog signal 68 in FIG. 3 can be generated by a sensor sensing a process variable.

Figure 5:
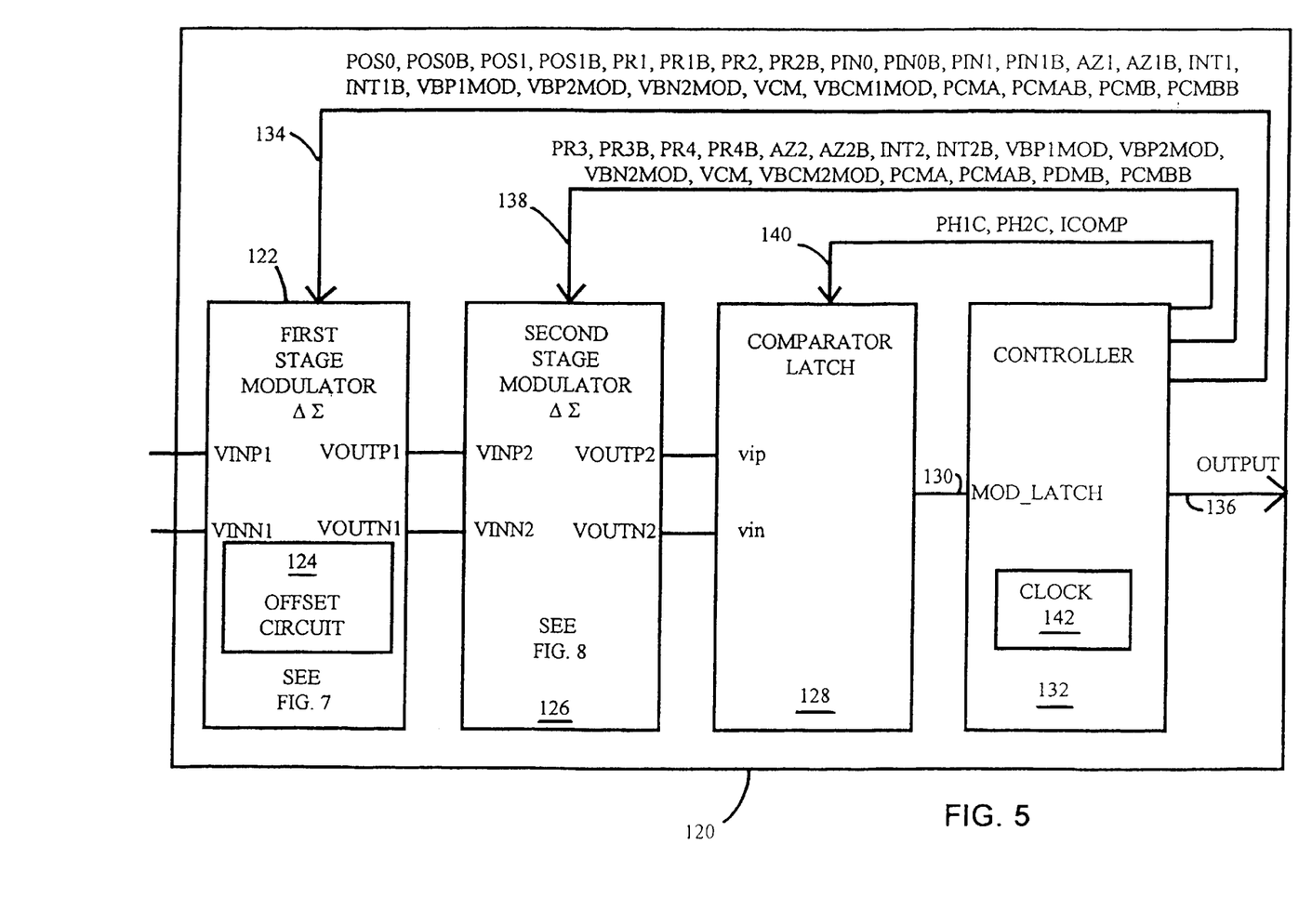
FIG. 5 is a block diagram of a second order delta sigma circuit.

In FIG. 5, a block diagram of a second order delta sigma circuit 120 is shown. A first stage delta sigma modulator 122 receives an analog input signal at VINP1 and VINN1 and generates a first integrated signal at VOUTP1 and VOUTN1. First stage delta sigma circuit 122 includes an offset circuit 124. An example of an embodiment of a first stage delta sigma modulator 122 with an offset circuit is described later in FIG. 7. A second stage delta sigma modulator 126 receives the first integrated signal from VOUTP1 and VOUTN1 at inputs VINP2 and VINN2. The second stage delta sigma modulator 126 generates a second integrated signal at VOUTP2 and VOUTN2. An example of such a second stage delta sigma modulator is described later in FIG. 8. A comparator latch 128 senses a zero crossover, or alternatively compares the second integrated signal to a reference level, typically DC common, and generates a latched output 130 as a function of the crossover or comparison. A controller 132 controlled by the latched output 130 generates a plurality of control signals 134 to the first stage delta sigma modulator and also generates a converted digital output signal 136. The first stage modulator 122 includes the offset circuit 124 that offsets the operation of the circuit 120 such that the converted digital 136 output is substantially free of tone noise that could otherwise interfere. Offset circuit 124 is a switched capacitor circuit that has switches that are pulse width modulated by controller 132 to control the amplitude of the offset current. Controller 132 generates a plurality of control signals 138 to the second stage modulator 126. The controller 132 also generates a plurality of control signals 140 to comparator latch 128. Busses 134, 138, 140 together comprise a bus of control signals for the circuit 120. Controller 132 is a clocked controller and includes or is coupled to a clock 142.

Figure 6:
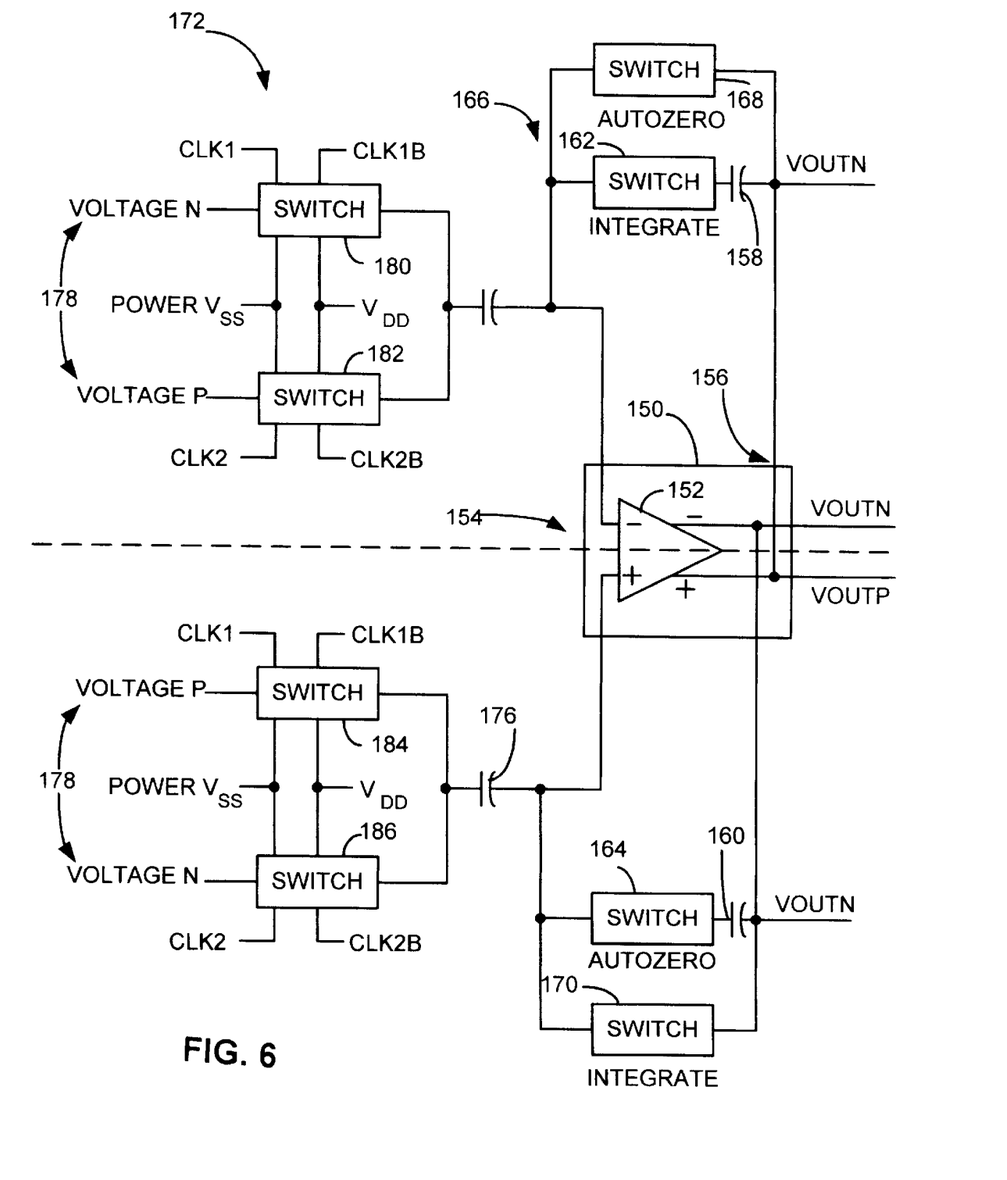
FIG. 6 is an illustration of a portion of a delta sigma modulator.

In FIG. 6, a portion of a delta sigma modulator, such as first stage modulator 122 or second stage modulator 126 is shown. A modular amplifier 150 includes amplifier 152 that has a differential amplifier input 154 and a differential amplifier output 156. The input 154 and output 156 are complementary type signals. Differential amplifier outputs 156 are coupled to integrating capacitors 158, 160 and switches 162, 164 and back to the differential amplifier inputs 154 to form a differential integrator 166. Integrator 166 further includes autozero switches 168, 170 coupling from differential outputs 156 back to differential inputs 154. Differential integrator 166 is thus arranged to receive and integrate charge packets and generate outputs indicative of the integrated charge.

Each delta sigma modulator stage, such as stages 122, 126 of FIG. 5, includes a plurality of charge packet generators such as an exemplary charge packet generator 172 as shown in FIG. 6. Each such charge packet generator couples to the differential input 154 of amplifier 152.

In FIG. 6, charge packet generator 172 includes capacitors 174, 176 for storing electrical charge that is proportion to a differential input voltage VOLTAGE N–VOLTAGE P at 178. Charge packet generator 172 also includes switches 180, 182, 184, 186 that are controlled, along with switches 162, 164, 168, 170 in integrator 166 to first charge capacitors 174, 176 and then discharge capacitors 174, 176 into integrator 166. Each switch in FIG. 6 is provided with energization power from power busses Vss and Vdd. Each switch is also provided with complementary control inputs from a controller (such as controller 132 of FIG. to control the actuation of each switch. Switch 180, for example, is provided with control signals CLK1 and its inverted logical complement CLK1B; switch 182 is controlled with control signals CLK2 and its inverted logical complement CLK2B.

In FIG. 6, switches used in the delta sigma modulator are CMOS switches. It is desired that charges stored on capacitors 174, 176 be closely proportional to the charging potentials and not be affected by spurious charge injected by toggling the control inputs. Accordingly, switches involved in a charge transfer are clocked in a sequenced manner in time to reduce charge injection. The time delay needed for the sequencing is very short and typically on the order of a few gate propagation delay times. In FIG. 6, for example, openings of switches 180, 182, 184, 186 are delayed relative to openings of switches 162, 164, 168, 170 to reduce charge injection.

In FIG. 6, a typical sequence includes closing switch 168 and then switch 180 while switches 182 and 162 are open to charge capacitor 174 to VOLTAGE N. Next in the sequence, switch 168 would open to leave a charge stored on capacitor 174. Next in the sequence, switches 162, 182 would close to transfer the charge stored on capacitor 174 to the integrating capacitor 158. In a subsequent sequence, switches 182, 168, 162 are actuated to charge capacitor 174 to VOLTAGE P that is complementary to VOLTAGE N and store that charge on capacitor 158. In a synchronized sequence, switches 184, 186, 160, 170 are actuated to first store charges on capacitor 176 and then store those charges on integrating capacitor 160. The complementary output of the amplifier 152 thus represents the difference between stored charges on integrating capacitors 158, 160. The repeated complementary arrangements and duplications of inputs, outputs, and charging voltages causes error cancellation within the circuitry shown in FIG. 6.

In FIG. 6, by control of sequencing of charge transfers in charge packet generator 172 in a balanced and complementary manner as explained above, the charge packet generator operates as a highly accurate controlled current source that generates current proportional to input voltage. Exemplary charge packet generator 172, through its switching sequence used to integrate charge also operates as a sample and hold for the input voltages 178. When exemplary charge packet generator 172 is used as an offset circuit, the switches in the charge packet generator can have their timing set to adjust the amplitude of the offset current.

Figure 7:
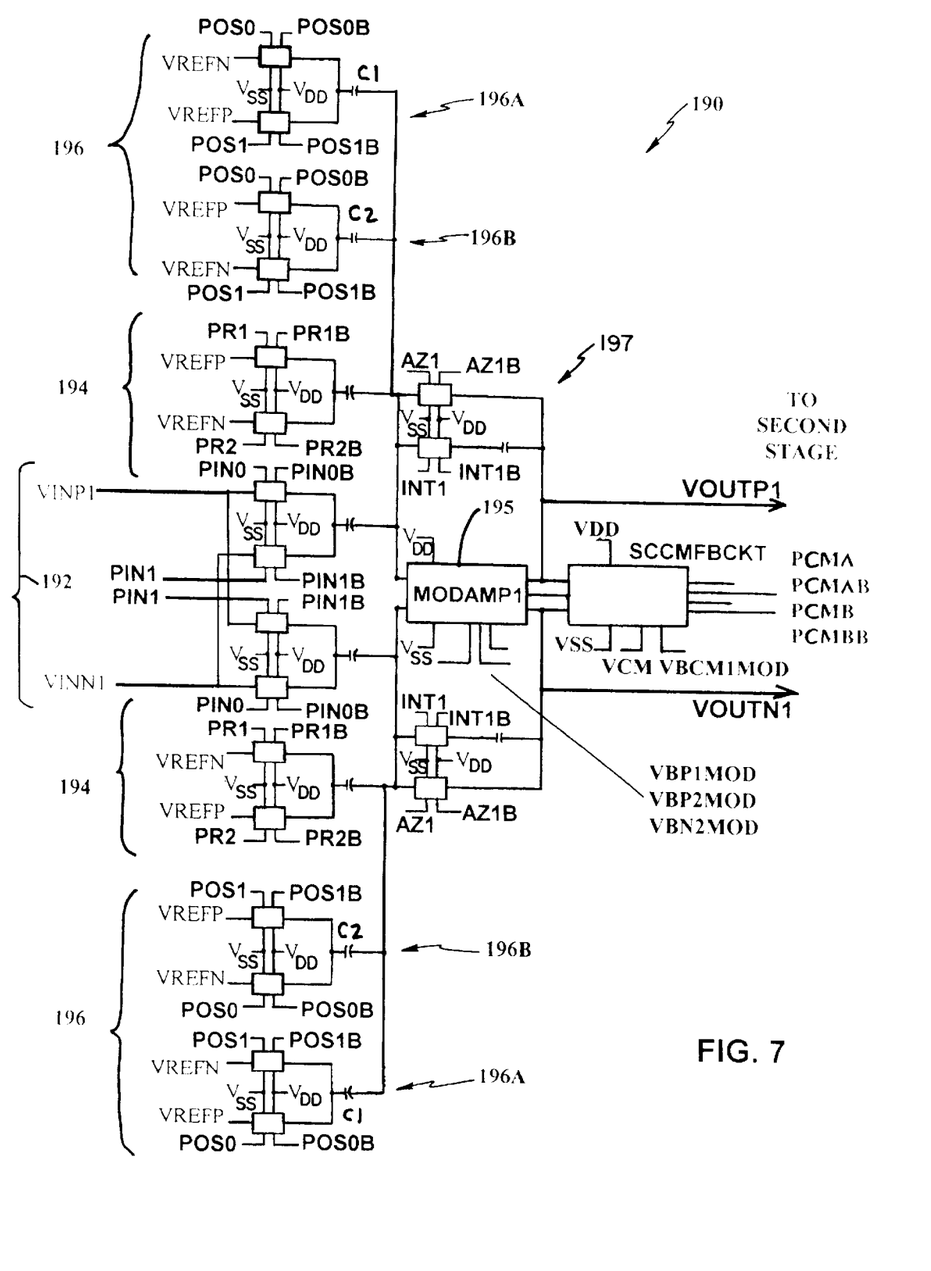
FIG. 7 is a schematic diagram of a first stage modulator.

In FIG. 7, a first stage delta sigma modulator circuit 190 is shown. Delta sigma modulator 190 comprises multiple charge packet generators, each operating as exemplary charge packet generator 172, explained above in connection with FIG. 6, and also a MODAMP 195 arranged as an integrator 197, also as explained above in connection with MODAMP 150 and integrator 166 of FIG. 6. A first charge packet generator 192, that is a switched capacitor circuit, receiving an analog input voltage at VINP1, VINN1 and generates an alternating reference current that is proportional to the analog input voltage to the differential inputs of MODAMP 195 in this first stage circuit 190.

In FIG. 7, a reference source provides references VREFP and VREFN to a second charge packet generator 194 that is a switched capacitor circuit. The second charge packet generator 194 receives the reference and generates balancing current proportional to the reference to the differential inputs of the first stage integrator 197 in an alternating manner.

In FIG. 7, the references VREFP and VREFN are also provided to a third charge packet generator 196 that is a switched capacitor circuit. The switched capacitor circuit 196 receives the reference and generates offset current proportional to the reference to the differential inputs of the first stage integrator 197. The offset current tracks the balancing current as a function of the reference. The third charge packet generator 196 can include two charge packet generators 196A and 196B as shown in FIG. 6 that have capacitors with slightly different values of capacitance C1 and C2. The two capacitances C1 and C2 are both large relative to the difference between the capacitances (C1−C2) and the offset current is a function of (C1−C2). The capacitances C1 and C2 generate thermal noise proportional to $(KT/C1)^{0.5}$ and $(KT/C2)^{0.5}$ respectively, and the thermal noise so generated, with two differencing generators 196A and 196b, is less than thermal noise proportional to $(KT/(C1-C2))^{0.5}$. The arrangement thus provides a desired small effective capacitance delivering a small offset current, while having the better noise performance of larger capacitors.

Figure 8:
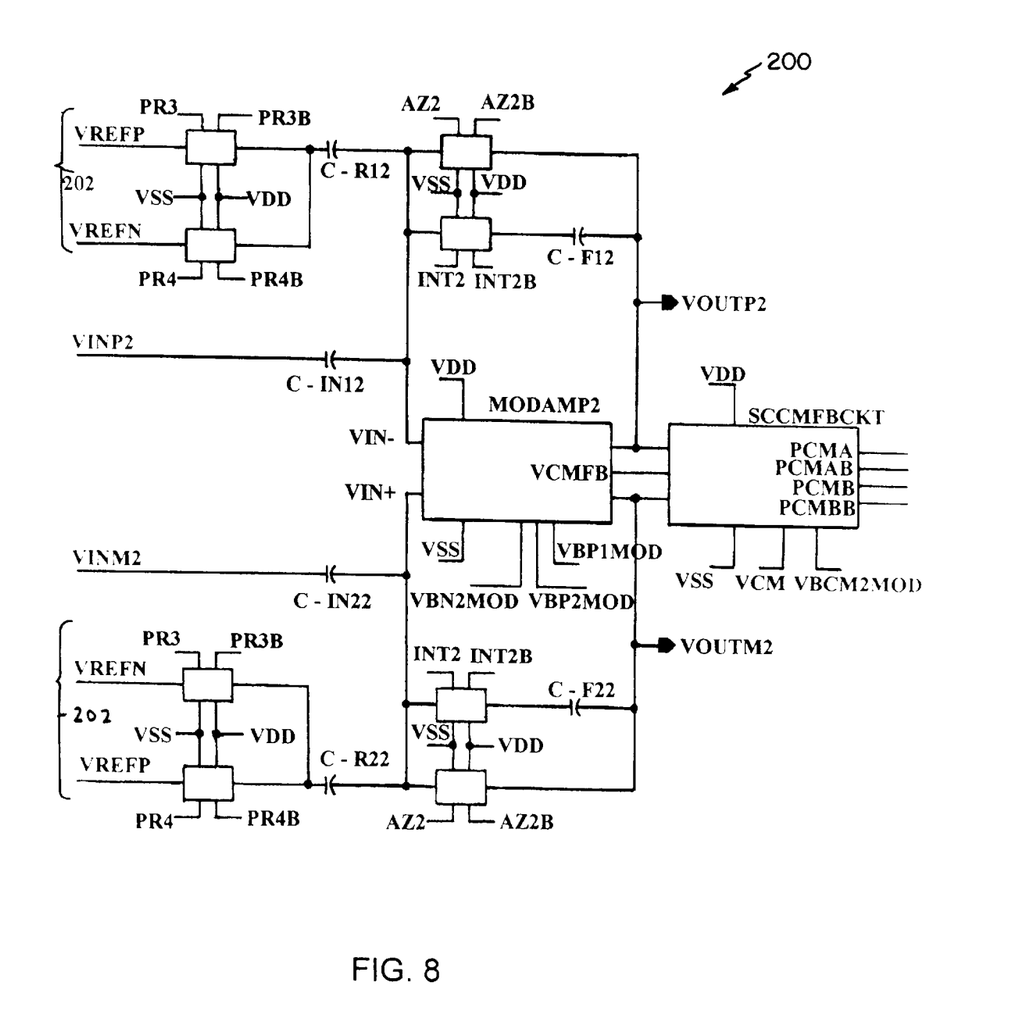
FIG. 8 is a schematic diagram of a second stage modulator.

The first stage delta sigma modulator 190 of FIG. 7 generates a complementary or differential output voltage VOUTP1–VOUTP2 proportional to the integral of the currents received from charge packet generators 192, 194, 196. These outputs are in a switching form as needed to feed into a second stage delta sigma modulator as shown in FIG. 8 without additional switches. These outputs VOUTP1–VOUTN1 of MODAMP1 are maintained approximately in the middle between VDD and VSS by a feedback circuit SCCMFBCKT that monitors these outputs and generates feedback to adjust the biasing of MODAMP1 outputs.

In FIG. 8, a second stage delta modulator 200 is shown with charge packet generator 202 for generating balancing current and capacitors C-IN12 and C-IN22 for generating input current from first stage modulator 190 in FIG. 7. Operation of the second stage delta sigma modulator 200 is similar to the operation of the first stage delta sigma modulator 190 of FIG. 7. The outputs VOUTP2–VOUTM2 of MODAMP2 in FIG. 8 are maintained approximately in the middle between VDD and VSS by a feedback circuit SCC-MFBCKT that monitors these outputs and generates feedback to adjust the biasing of MODAMP2 outputs.

By providing two stages of delta sigma modulation, the delta sigma circuit can be operated at a lower clock frequency, that saves power and adapts the delta sigma circuit for use with low power transmitters as used in the fluid process control industry.

Figure 9:
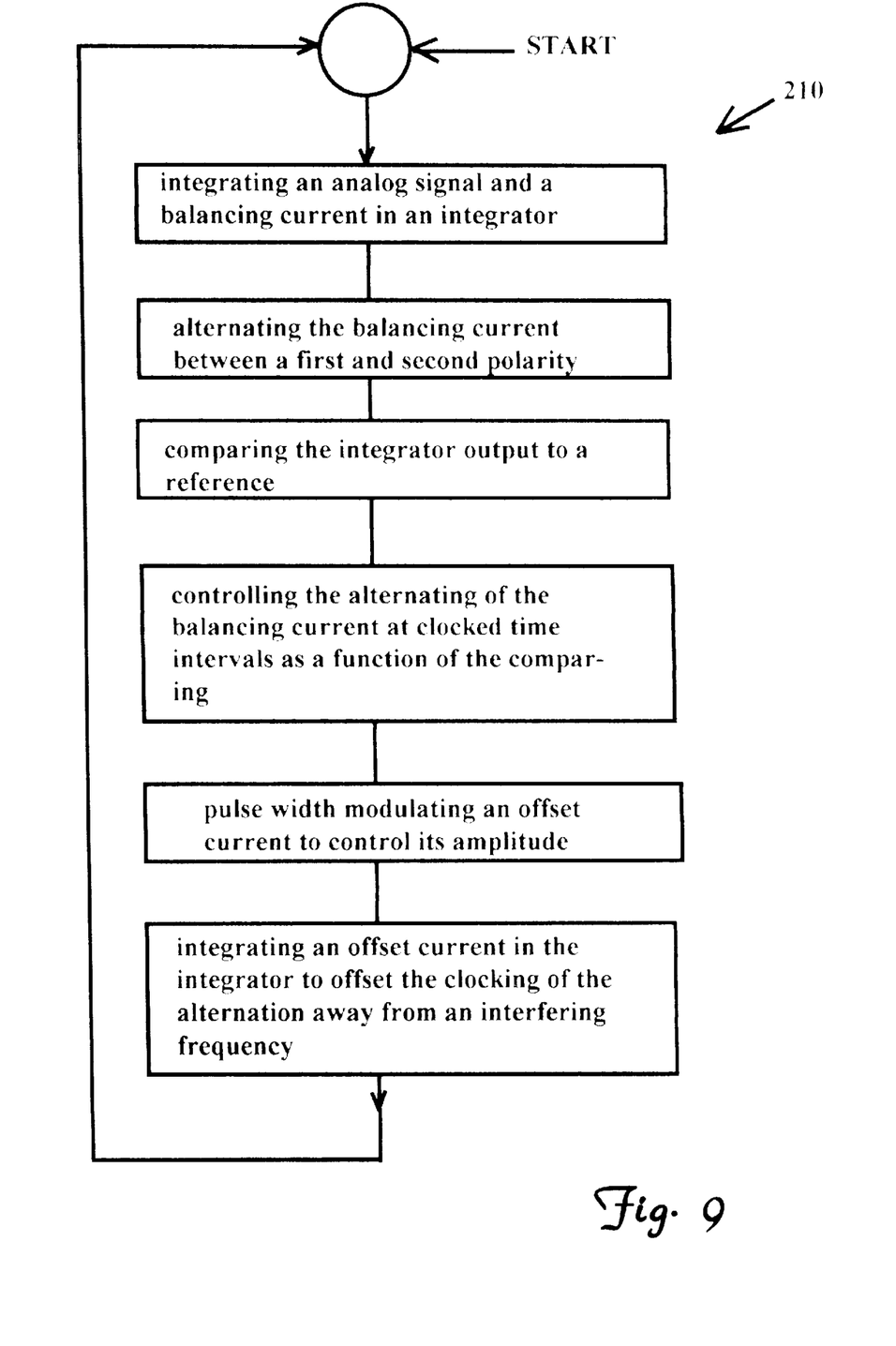
FIG. 9 is a flow chart of processes performed in a delta sigma circuit and a connected offset circuit.

In FIG. 9, a method of converting an analog signal to a digital signal that can be used here involves several processes as shown at 210 in FIG. 9. In a first process, there is integrating of the analog signal and a balancing current in an integrator. In a further process, there is alternating the balancing current between a first polarity and a second polarity. In a further process, the integrator output is compared to a reference, typically zero crossing with a differential amplifier output. Alternation of the balancing current is controlled at clocked time intervals as a function of the comparing. An offset current is pulse width modulated to control its amplitude to a desired level that avoids interference. The offset current is integrated in the integrator to offset the alternation away from an interfering frequency. Processes 210 shown in FIG. 9 are going forward in a sequenced, overlapping or continuous manner as the circuitry operates as needed to meet the needs of a particular application. The processes 210 are controlled by the actuation of switches and can be executed by a microprocessor to control switch actuation from executable code stored in memory.

Figure 10:
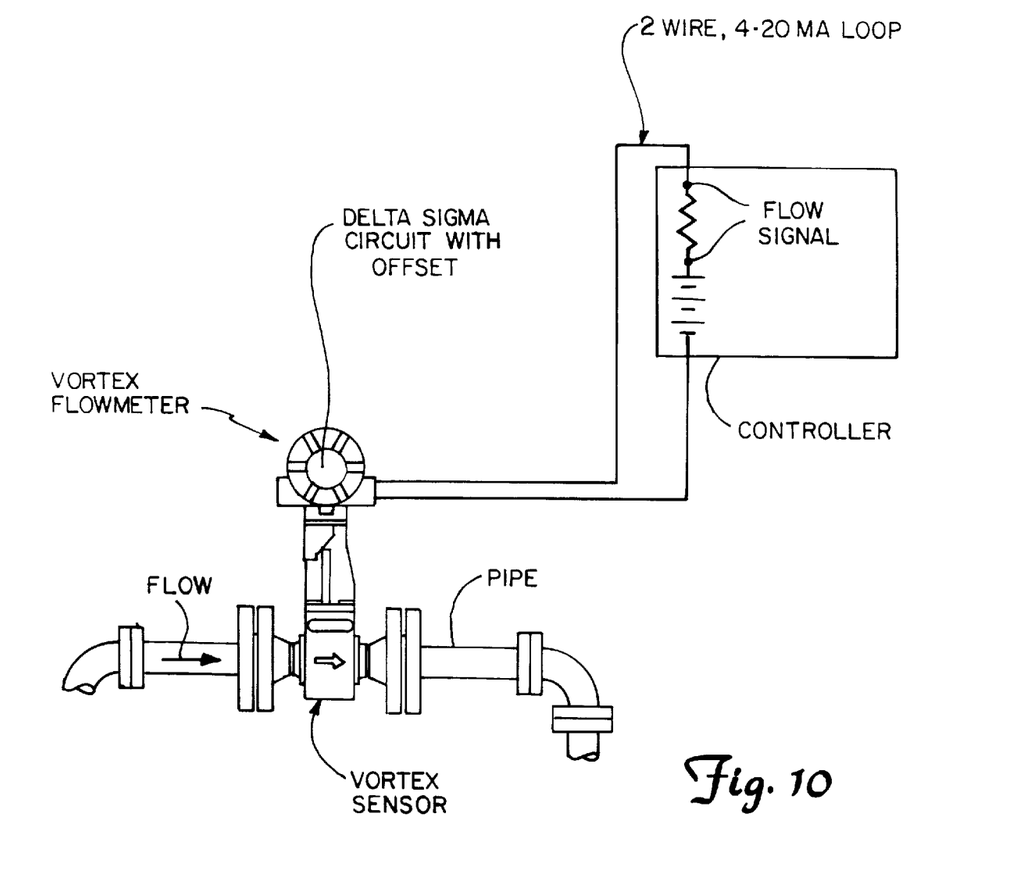
FIG. 10 is a diagram of a vortex flowmeter with an offset delta sigma circuit.

The sequences of process shown above can be stored as instructions on a cornputer-readable medium such as a floppy disc or CD ROM and downloaded into memory in a controller of a delta sigma circuit if desired. The controller can also be a custom integrated circuit that provides control of the switches in the delta sigma modulators. in FIG. 10, a vortex flowmeter is shown installed in a typical environment sensing flow in a line and providing an output representing the flow to a 2 wire, 4–20 mA control loop which provides all of the electrical energization to the vortex flowmeter. The output of the vortex flowmeter shown in FIG. 10 has an output which has improved accuracy and freedom from tone noise because of the use of a sigma delta circuit with a pulse width modulated offset to suppress tone noise.

Although the present invention has been described with reference to preferred embodiments, workers skilled in the art will recognize that changes can be made in form and detail without departing from the spirit and scope of the invention. For example, various function blocks of the invention have been described in terms of circuitry, however, many function blocks may be implemented in other forms such as digital and analog circuits, software and their hybrids. When implemented in software, a microprocessor performs the functions and the signals comprise digital values on which the software operates. A general purpose processor programmed with instructions that cause the processor to perform the desired process elements, application specific hardware components that contain circuit wired to perform the desired elements and any combination of programming a general purpose processor and hardware components can be used. Any sequence of switch closures that achieves the desired charge transfers for operation of a delta sigma circuit can be used. Examples of switch sequencing for switched capacitor delta sigma circuits can be found by reference to U.S. Pat. No. 5,083,091 to Frick et al.

Because of the nature of complex digital circuitry, circuit elements may not be partitioned into separate blocks as shown, but components used for various functional blocks can be intermingled and shared. Likewise with software, some instructions can be shared as part of several functions and be intermingled with unrelated instructions within the scope of the invention.

What is claimed is:

1. A delta sigma analog-to-digital circuit, comprising:
   a delta sigma analog-to-digital converter that is a delta sigma circuit having an integrator input couplable to an analog signal and having a clocked controller generating a converted digital output representing the analog signal; and
   an offset circuit generating an offset current to the integrator input that electronically offsets the frequency of noise in the converted output, the offset circuit comprising a switched capacitor circuit that is pulse width modulated by the clocked controller.

2. The circuit of claim 1 wherein the delta sigma circuit comprises a delta sigma modulator controlled by the clocked controller.

3. The circuit of claim 2 further comprising a reference coupled to the delta sigma modulator and the offset circuit, the offset circuit and the delta sigma modulator the reference.

4. The circuit of claim 3 wherein the clocked controller controls the amplitude of the offset current by modulating the time during which switches are closed in the offset circuit.

5. The circuit of claim 4 further comprising a digital processor circuit receiving the converted digital output and generating a transmitter output signal.

6. The circuit of claim 5 wherein the transmitter output signal is a 4–20 mA current.

7. The circuit of claim 5 wherein the transmitter output signal is a Fieldbus signal.

8. The circuit of claim 5 further comprising a sensor sensing a process variable and generating the analog signal.

9. The circuit of claim 8 further comprising a clock coupling a clock signal to the clocked controller.

10. The circuit of claim 9 wherein the sensor senses a property of a fluid and the circuit is sealed in a transmitter housing.

11. The circuit of claim 10 wherein the sensor is a vortex flow sensor.

12. The circuit of claim 1 wherein the noise that is offset by the offset current is tone noise that is offset from an interfering frequency to a different frequency where interference is reduced.

13. A delta sigma analog-to-digital circuit, comprising:
   an integrator with an integrator input couplable to an analog signal and generating an integrated output;
   a comparator receiving the integrated output, and generating a comparison output;
   a controller receiving the comparison and generating a plurality of clocked control outputs and a converted output representing the analog signal;
   a balancing circuit receiving clocked control outputs and generating a balancing current to the integrator input wherein the balancing current changes polarity as a function of the controller outputs; and
   an offset circuit generating an offset current to the integrator input, the offset circuit including an electronic switch that is pulse width modulated by the controller to electrically offset the frequency of the converted output.

14. The circuit of claim 13 further comprising a digital processor circuit receiving the converted digital output and generating a transmitter output signal.

15. The circuit of claim 13 wherein the circuit comprises a clock coupled to the controller.

16. The circuit of claim 13 further comprising a reference coupled to the balancing circuit and the offset circuit, the offset circuit tracking the balancing circuit as a function of the reference.

17. The circuit of claim 13 wherein the noise that is offset by the offset current is tone noise that is offset from an interfering frequency.

18. The circuit of claim 13 wherein the integrator, comparator, controller and balancing circuit function as a delta sigma analog-to-digital converter.

19. The circuit of claim 13 further comprising a sensor sensing a process variable and generating the analog signal.

20. The circuit of claim 19 wherein the sensor senses a property of a fluid and the circuit is sealed in a transmitter housing.

21. A delta sigma analog-to-digital circuit, comprising;
a first-stage delta sigma modulator receiving an analog input signal and generating a first integrated signal;
a second stage delta sigma modulator coupled to the first-stage delta sigma modulator and receiving the first integrated signal and generating a second integrated signal;
a comparator comparing the second integrated signal to a reference level and generating a latched output as a function of the comparison;
a controller controlled by the latched output, the controller generating a plurality of control signals to the first stage delta sigma modulator and a converted digital output signal; and
the first stage modulator further including a pulse width modulated offset circuit that offsets the operation of the circuit.

22. The circuit of claim 21 wherein the first stage delta sigma modulator comprises an amplifier with a differential input and a differential output such that the first integrated output is a complementary output.

23. The circuit of claim 22 wherein the second stage delta sigma modulator comprises an amplifier with a differential input and a differential output such that the second integrated output is a complementary output.

24. The circuit of claim 22 wherein the first stage delta sigma modulator comprises:
a first switched capacitor circuit receiving the analog input and generating input current proportional to the analog input to the differential inputs of the first stage.

25. The circuit of claim 24 wherein the first stage delta sigma modulator comprises:
a reference source generating a reference; and
a second switched capacitor circuit receiving the reference source and generating balancing current proportional to the reference to the differential inputs of the first stage.

26. The circuit of claim 25 wherein the first stage delta sigma modulator comprises:
a third switched capacitor circuit receiving the reference and generating offset current proportional to the reference to the differential inputs of the first stage.

27. The circuit of claim 26 wherein the offset current tracks the balancing current as a function of the reference.

28. The circuit of claim 27 wherein the third switched capacitor circuit comprises two capacitors with different capacitances C1 and C2.

29. The circuit of claim 28 wherein the two capacitances C1 and C2 are both large relative to the difference between the capacitances (C1−C2) and the offset current is a function of (C1−C2).

30. The circuit of claim 29 where in the capacitances C1 and C2 generate thermal noise proportional to $(KT/C1)^{0.5}$ and $(KT/C2)^{0.5}$ respectively, and the thermal noise so generated is less than thermal noise proportional to $(KT/(C1-C2))^{0.5}$.

31. A delta sigma method of converting an analog signal to a digital signal, comprising;
integrating the analog signal and a balancing current in an integrator;
alternating the balancing current between a first polarity and a second polarity;
comparing the integrator output to a reference;
controlling the alternating of the balancing current at clocked time intervals as a function of the comparing;
pulse width modulating an offset current to control its amplitude; and
integrating an offset current in the integrator to offset the clocking of the alternating away from an interfering frequency.

32. A computer-readable medium having stored thereon a plurality of sequences of instructions, the plurality of sequences of instructions including sequences that, when executed by a controller in a delta sigma analog to digital converter, cause the delta sigma analog to digital converter to perform a sequence, comprising:
integrating an analog signal and a balancing current in an integrator;
alternating the balancing current between a first polarity and a second polarity;
comparing the integrator output to a reference;
controlling the alternating of the balancing current at clocked time intervals as a function of the comparing;
pulse width modulating the offset current to control its amplitude; and
integrating an offset current in the integrator to offset the clocking of the alternating away from an interfering frequency.

33. A delta sigma analog-to-digital circuit, comprising;
a first-stage delta sigma modulator receiving an analog input signal and generating a first integrated signal;
a second stage delta sigma modulator coupled to the first-stage delta sigma modulator and receiving the first integrated signal and generating a second integrated signal;
a comparator comparing the second integrated signal to a reference level and generating a latched output as a function of the comparison;
a controller controlled by the latched output, the controller generating a plurality of control signals to the first stage delta sigma modulator and a converted digital output signal; and
offset circuit means coupled to the first stage delta sigma modulator for pulse-width-modulating an offset current in the first stage delta sigma modulator.

* * * * *

UNITED STATES PATENT AND TRADEMARK OFFICE
CERTIFICATE OF CORRECTION

PATENT NO. : 6,140,952
DATED : October 31, 2000
INVENTOR(S) : Michael Gaboury

It is certified that error appears in the above-identified patent and that said Letters Patent is hereby corrected as shown below:

Title page,
Item [56], Reference Cited, U.S. PATENT DOCUMENTS
-- 5,835,038    11/1988         Nakao et al. ................... 341/131

OTHER PUBLICATIONS
-- Wai Lee, "A 4-Channel 18B Sigma Delta Modulator IC
With Chopped-Offset Stabilization," IEEE
International Solid State Circuits Conference, Vol.
39, 2/1/96, pps. 238-239, 453.

6.4.6 Delta-Sigma-Umsetzer," pp. 384-386, Electrische
Messtechnik, E. Schruefer, 6th Edition, 1995 Carl
Hanser Verlag, Munich (with English translation).

Steven R. Norsworthy, Richard Schreier and Gabor C.
Temes, "Delta-Sigma Data Converters, Theory, Design
and Simulation," The Institute of Electrical and
Electronics Engineers, Inc., New York, 1997, Ch 2,
pp. 44-75.

Robert M. Gray, "Quantization Noise Spectra", IEEE
Transactions on Information Theory, Vol. 36, No. 6,
November 1990, pp. 1220-1244.

James C. Candy and O' Connell J. Benjamin, "The
Structure of Quantization Noise from Sigma-Delta
Modulation", IEEE Transactions on Communications,
Vol. Com-29, No. 9, September 1981, pp. 1316-1323.

UNITED STATES PATENT AND TRADEMARK OFFICE
CERTIFICATE OF CORRECTION

PATENT NO. : 6,140,952
DATED : October 31, 2000
INVENTOR(S) : Michael Gaboury

It is certified that error appears in the above-identified patent and that said Letters Patent is hereby corrected as shown below:

Column 8,
Lines 19-21, delete ", the offset circuit and the delta sigma modulator the reference".

Signed and Sealed this

Second Day of April, 2002

Attest:

JAMES E. ROGAN
Attesting Officer            Director of the United States Patent and Trademark Office